(12) United States Patent
Kumar et al.

(10) Patent No.: US 9,741,431 B2
(45) Date of Patent: Aug. 22, 2017

(54) OPTIMAL READ THRESHOLD ESTIMATION (71) Applicant: SK hynix memory solutions inc., San Jose, CA (US)

(72) Inventors: Naveen Kumar, San Jose, CA (US); Frederick K. H. Lee, Mountain View, CA (US); Christopher S. Tsang, Santa Clara, CA (US); Lingqi Zeng, San Jose, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 0 days.

(21) Appl. No.: 14/937,833

(22) Filed: Nov. 10, 2015

(65) Prior Publication Data

US 2016/0133333 A1 May 12, 2016

Related U.S. Application Data

(60) Provisional application No. 62/077,606, filed on Nov. 10, 2014.

(51) Int. Cl.
| | | |
|---|---|---|
| G11C 11/56 | (2006.01) | |
| G11C 16/26 | (2006.01) | |
| G11C 16/04 | (2006.01) | |
| G11C 16/34 | (2006.01) | |
| G11C 29/02 | (2006.01) | |

(52) U.S. Cl.
CPC ...... *G11C 11/5642* (2013.01); *G11C 16/0483* (2013.01); *G11C 16/26* (2013.01); *G11C 16/3427* (2013.01); *G11C 29/021* (2013.01); *G11C 29/028* (2013.01)

(58) Field of Classification Search
CPC . G11C 11/5642; G11C 16/26; G11C 16/0483; G11C 16/3427; G11C 29/021; G11C 29/028
USPC ............. 365/185.03, 185.02, 185.08, 189.15
See application file for complete search history.

(56) References Cited

U.S. PATENT DOCUMENTS

| | | | |
|---|---|---|---|
| 8,923,062 B1 | 12/2014 | Lee et al. | |
| 8,924,824 B1* | 12/2014 | Lu | G06F 11/1048 365/185.2 |
| 9,007,854 B1* | 4/2015 | Nemati Anaraki | G06F 11/10 365/189.09 |
| 9,269,449 B2 | 2/2016 | Lee et al. | |
| 2009/0043951 A1* | 2/2009 | Shalvi | G11C 11/56 711/103 |
| 2010/0103731 A1* | 4/2010 | Yoo | G11C 16/3427 365/185.02 |
| 2010/0118608 A1* | 5/2010 | Song | G11C 11/5642 365/185.11 |

(Continued)

*Primary Examiner* — Vu Le
*Assistant Examiner* — Sung Cho
(74) *Attorney, Agent, or Firm* — IP & T Group LLP (57) ABSTRACT

An optimal read threshold estimation method includes determining a flip difference corresponding to an optimal step size $\Delta_{opt}$, estimating a first slope $m_1$ at a first read point and a second slope $m_2$ at a second read point, and obtaining an optimal read threshold ($X^{LP}_{opt}$) as the intersection of a first line with the first slope $m_1$ and a second line with the second slope $m_2$.

24 Claims, 7 Drawing Sheets

(56) References Cited

U.S. PATENT DOCUMENTS

| | | | |
|---|---|---|---|
| 2013/0176775 A1* | 7/2013 | Tang | G11C 16/26 |
| | | | 365/185.2 |
| 2013/0229867 A1* | 9/2013 | Tang | G11C 16/26 |
| | | | 365/185.2 |
| 2014/0201580 A1* | 7/2014 | Desireddi | G06F 12/0246 |
| | | | 714/721 |
| 2015/0131376 A1 | 5/2015 | Tsang et al. | |

* cited by examiner

| | Cell 1 | Cell 2 | Cell 3 | Cell 4 |
|---|---|---|---|---|
| Read @ $R_1$ | 0 | 0 | 1 | 1 |
| Read @ $R_2$ | 0 | 1 | 0 | 1 |

OPTIMAL READ THRESHOLD ESTIMATION

CROSS-REFERENCE TO RELATED APPLICATIONS

This application claims priority to U.S. Provisional Patent Application No. 62/077,606 entitled "OPTIMAL READ THRESHOLD PLACEMENT FOR MLC NAND" filed Nov. 10, 2014, the contents of which is incorporated herein by reference for all purposes.

BACKGROUND

1. Technical Field

Various embodiments generally relate to a solid state storage system, and, more particularly, to optimal read threshold estimation in the solid state storage system.

2. Related Art

Data storage technology, which can provide benefits like lower cost, reduced weight, lower power consumption, higher throughput, etc., is always an attractive solution for meeting future data storage demands. The NAND-based technology may provide all of the above benefits, but cannot always be produced at a lower cost. There exists a need to bring down the cost by scaling down the NAND process. This cost advantage, however, often results in a reduction of NAND reliability, which affects data integrity. The data integrity can be improved by applying advanced coding and signal processing techniques. Thus, there exists a need for improved coding and signal processing techniques.

SUMMARY

Various embodiments are directed to an optimal read threshold estimate method and system in the solid state storage system.

In an embodiment, an optimal read threshold estimation method may include determining a flip difference corresponding to an optimal step size $\Delta_{opt}$, estimating a first slope m1 at a first read point and a second slope $m_2$ at a second read point, and obtaining an optimal read threshold ($X^{LP}_{opt}$) as the intersection of a first line with the first slope $m_1$ and a second line with the second slope $m_2$.

In an another embodiment, a system may include a solid state storage, an optimal read threshold estimator, and an interface suitable for communicating with the solid state storage and the optimal read threshold estimator, the optimal read threshold estimator being suitable for determining a flip difference corresponding to an optimal step size $\Delta_{opt}$, estimating a first slope $m_1$ at a first read point and a second slope $m_2$ at a second read point, and obtaining an optimal read threshold ($X^{LP}_{opt}$) as the intersection of a first line with the first slope $m_1$ and a second line with the second slope $m_2$.

In an another embodiment, a computer implemented process for estimating an optimal read threshold comprises program instructions to determine a flip difference corresponding to an optimal step size Δopt, to estimate a first slope m1 at a first read point and a second slope m2 at a second read point, and to obtain an optimal read threshold (XLPopt) as the intersection of a first line with the first slope m1 and a second line with the second slope m2.

DETAILED DESCRIPTION

The invention can be implemented in numerous ways, including as a process; an apparatus; a system; a composition of matter; a computer program product embodied on a computer readable storage medium; and/or a processor, such as a processor suitable for execute for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

The terminology used herein is for describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, indicate the presence of stated features, but do not preclude the presence or addition of one or more other features.

In NAND based devices, the low density parity check (LDPC) coding technique is most commonly used for improving the data integrity. In a Multi-Level Cell (MLC) NAND, two bits (least significant bit (LSB) and most significant bit (MSB)) can be programmed on the NAND. While reading back the programmed data from an MLC NAND, three estimates (one for the A threshold, one for the B threshold, one for the C threshold) are used.

Figure 1:
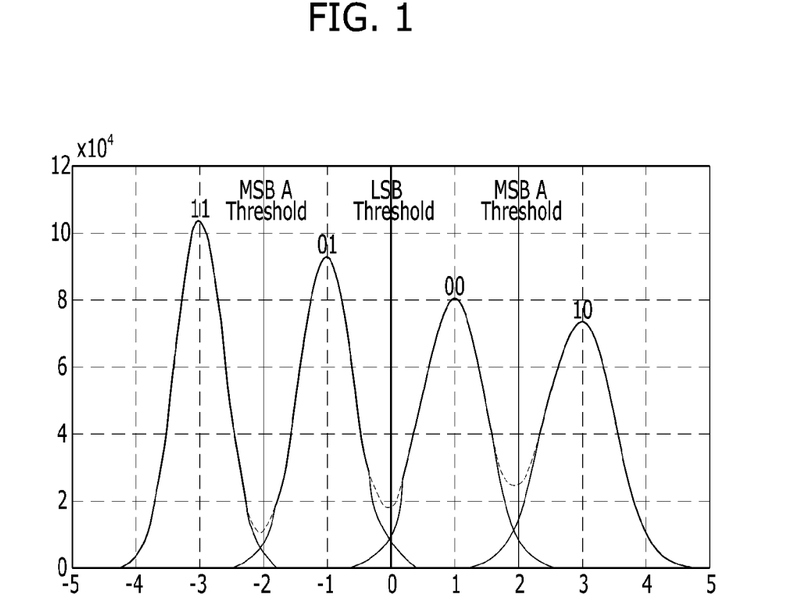
FIG. 1 is a histogram shown for different read back thresholds on the NAND device.

In FIG. 1, a histogram is shown for different read back thresholds on the NAND device. The LSB can be read back by using the B threshold and the MSB can be read back using the A and C thresholds simultaneously. In an ideal case, the optimal read thresholds should be placed on the intersection of different cell distributions (See FIG. 1). But the histogram information is not known while decoding LSB and MSB.

More information about finding an optimal read threshold can be found in U.S. Pat. No. 8,923,062, titled "Generating Read Thresholds Using Gradient Descent and without Side Information," U.S. Pat. Pub. No. 2015/0078084, titled "Generating Read Thresholds Using Gradient Descent and without Side Information," and U.S. Pat. Pub. No. 2015/0131376, titled "Threshold Estimation Using Bit Flip Counts and Minimums," which are incorporated herein by reference in their entirety.

One key drawback of these technique is that it can get stuck in local minima due to noisy read back data. On the NAND data, it has been observed that the read outputs for various read thresholds or the A threshold in MLC are noisy and the cell distribution for '11' level is much different from the cell distribution for '01' level. In this case, it is quite hard to predict the optimal read placement threshold. Thus, there is always a need for a better technique which can predict the optimal read threshold more accurately.

The problem of finding the optimal read threshold placement becomes more important in the context of a soft decoder because reads are placed around the predicted optimal read threshold to get the soft information on the written data. This soft information is further used in the LDPC decoder in the decoding procedure. If the estimation of the optimal threshold is not accurate, the soft LDPC decoder cannot improve the data integrity. Thus, it is very important to find an optimal read threshold for the hard decision decoding as well as the soft decoding.

A novel technique which can predict the optimal read thresholds accurately is disclosed, and provides performance gains close to the performance using a genie read threshold. In the genie performance, it is assumed that a genie tells the actual optimal read threshold.

Figure 2:
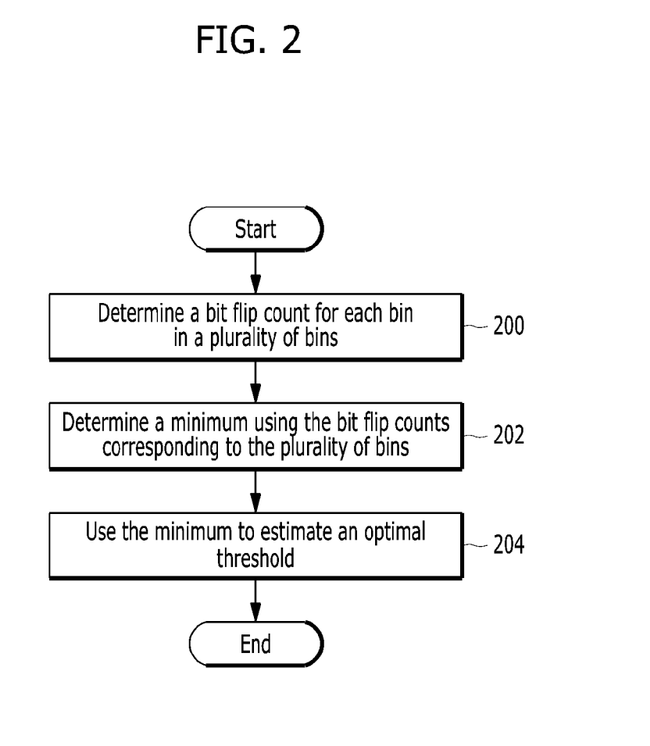
FIG. 2 is a flowchart illustrating a process for estimating an optimal threshold.

Referring next to FIG. 2, a flowchart of steps for estimating an optimal threshold is shown. When a read is performed on a solid state storage system, one or more thresholds are used to perform the read. For example, in single-level cell (SLC) systems (where a cell stores a single bit), a single threshold is used to perform a read. If a given cell has a voltage which is less than the threshold, then a value of 1 is read. If the voltage stored by the cell is greater than the threshold, then a value of 0 is read. The threshold that returns the fewest bit errors (e.g., when the read-back bit sequence is compared to the correct or actual bit sequence) is referred to as the optimal threshold and the process of FIG. 2 estimates the value of the optimal threshold.

At step 200, a bit flip count is determined for each bin in a plurality of bins. The bit flip count may be determined by (1) performing a first read on a group of solid state storage cells at a first threshold that corresponds to a lower bound for a given bin, and (2) performing a second read on the same group of solid state storage cells at a second threshold that corresponds to an upper bound for the given bin. The bit flip count is calculated based on the read back values from the first read at (1) and the second read at (2).

Figure 3A:
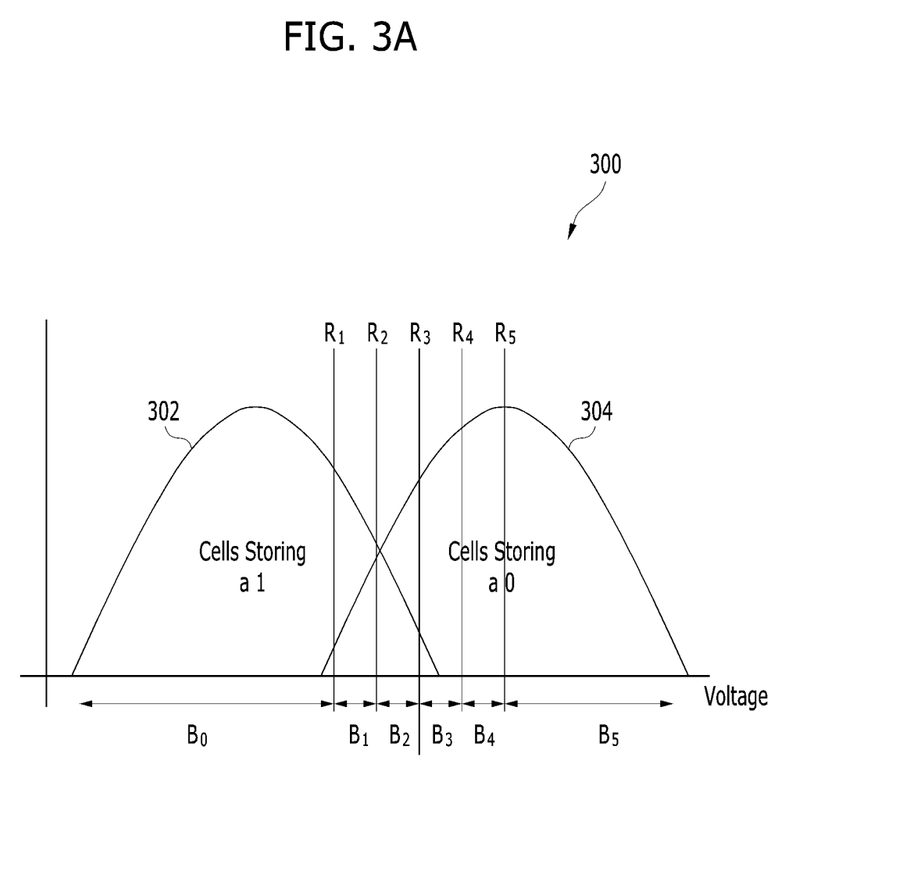
FIGS. 3A and 3B are a diagram showing SLC distributions.
Figure 3B:
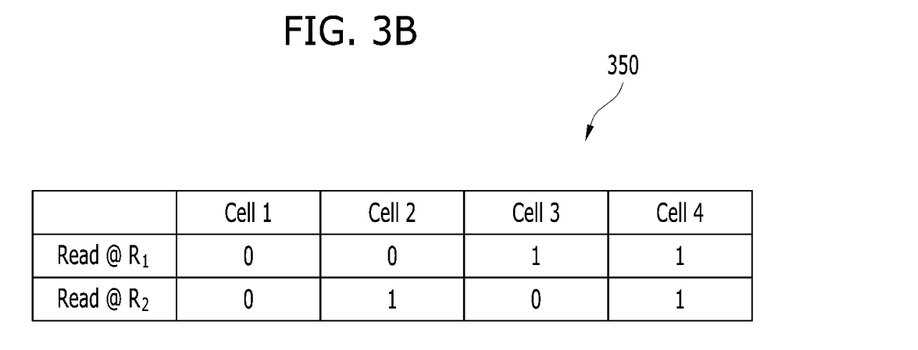

See, for example, FIGS. 3A and 3B, which are diagrams showing an embodiment of SLC distributions. The method of FIG. 2 may be performed in order to estimate the voltage at which distribution 302 and distribution 304 intersect, since the optimal threshold corresponds to the voltage at which two distributions intersect. In diagram 300, distribution 302 corresponds to cells correctly storing a 1 and distribution 304 corresponds to cells correctly storing a 0. Any bit mapping may be used and the bit mappings described herein are merely exemplary.

In diagram 300, for each of bins B1-B4, a corresponding bit flip count would be determined. To determine the bit flip count for bin B1, a first read is performed at threshold voltage R1 and a second read is performed at threshold voltage R2. If any of the bits flip (i.e., change) between the read at threshold voltage R1 and threshold voltage R2, then the bit flip count is incremented.

Diagram 350 shows exemplary read-back bit sequences, which are returned by the reads at threshold voltage R1 and threshold voltage R2. In this example, the group of cells being read contains four cells. The read-back values for cell 1 and cell 4 are consistently a 0 and a 1 and thus do not correspond to bit flips such that the bit flip count is not incremented.

In some embodiments, only plausible or expected bit flips are counted at step 200 in FIG. 2. For example, referring to the read-back values of cell 2 in diagram 350, a value of 0 is returned by the read of cell 2 at threshold voltage R1. Therefore, it can be inferred that cell 2 is storing a voltage which is greater than R1 (i.e., stored-voltage (cell 2)>R1). The read of cell 2 at threshold voltage R2 returned a 1, which corresponds to cell 2 storing a voltage which is less than R2 (i.e., stored-voltage (cell 2)<R2). These two inequalities are not incompatible, since the range R1<stored-voltage (cell 2)<R2 satisfies both inequalities. This is one example of a plausible bit flip.

In contrast, the bit flip shown by cell 3 is implausible. A returned value of 1 at threshold voltage R1 corresponds to a stored voltage which is less than R1 (i.e., stored-voltage (cell 3)<R1). However, the returned value of 0 at threshold voltage R2 corresponds to a stored voltage which is greater than R2 (i.e., stored-voltage (cell 3)>R2). There is no value of stored-voltage (cell 3) which satisfies both inequalities because the value cannot be both less than R1 and greater than R2. This is one example of an implausible bit flip and in some embodiments such implausible bit flips are not counted at step 200 in FIG. 2.

Oftentimes, implausible bit flips are due to read noises and if two threshold voltages (e.g., R1 and R2) are sufficiently separated implausible bit flips will not occur. Therefore, in some embodiments, there is no differentiation between the plausible and implausible bit flips. All the bit flips are counted in such embodiments.

Returning to FIG. 2, at step 202, a minimum (e.g., a minimum bit, a minimum bin, etc.) is determined using the bit flip counts corresponding to the plurality of bins. At step 204, the minimum (e.g., minimum bit, minimum bin, etc.) is used to estimate an optimal threshold. Steps 202 and 204 are described in detail with reference to FIGS. 3A-6B below.

Although the subscript numbering of placed thresholds (i.e., R1-R5) shown in FIG. 3A and other figures may imply a certain sequence or ordering of reads (e.g., from left to right), this is merely for illustrative purposes. Any sequence or ordering of reads may be performed as will be understood to those of skill in the art from the disclosure herein. For example, the read at threshold voltage R2 may be performed first and the read at threshold voltage R1 may be performed second if desired.

Figure 4:
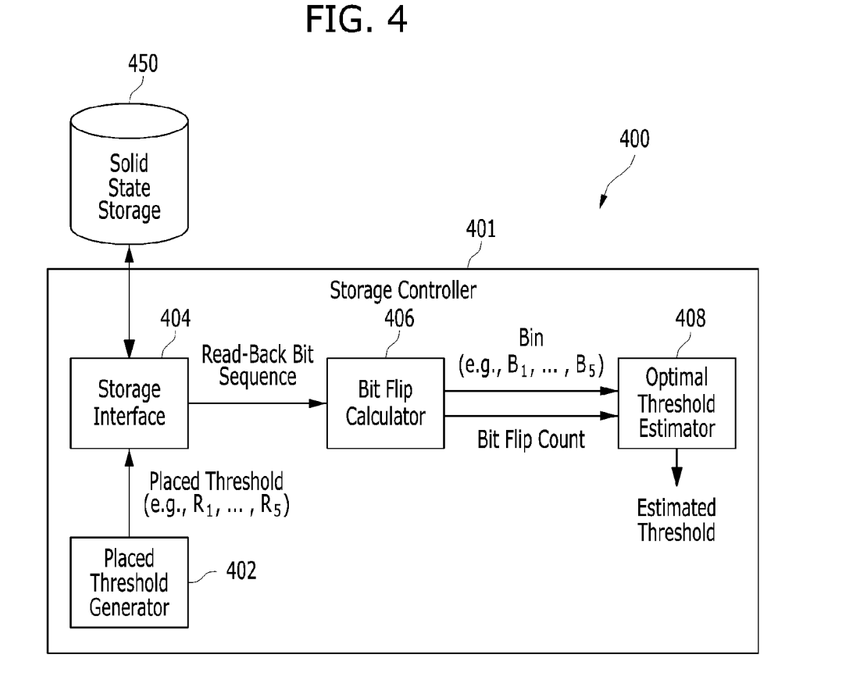
FIG. 4 is a diagram illustrating a storage controller, which performs optimal threshold estimation.

FIG. 4 is a diagram illustrating embodiment system 400 including a storage controller 401 and a solid state storage 450. The storage controller 401 may perform optimal threshold estimation. In some embodiments, a storage controller 401 is implemented on a semiconductor device, such as an application-specific integrated circuit (ASIC) or a field-programmable gate array (FPGA). In some embodiments, the storage controller 401 includes a first semiconductor device (i.e., a first "chip") and a solid state storage 450 includes a second semiconductor device (i.e., a second "chip"). In some embodiments, a single storage controller manages multiple "chips" of solid state storage.

The system 400 may include a solid state storage 450. In one example, the solid state storage 450 includes NAND Flash. In various embodiments, the solid state storage 450 includes SLC storage where a cell stores 1 bit, multi-level cell (MLC) storage where a cell stores 2 bits, or tri-level cell (TLC) storage where a cell stores 3 bits. In some embodiments, the solid state storage 450 includes multiple types of storage (e.g., SLC storage as well as MLC storage).

In the example shown, the storage controller 401 may include a placed threshold generator 402 that generates placed thresholds. Referring to diagram 300 in FIG. 3A as an example, the placed threshold generator 402 generates placed thresholds R1-R5. In some embodiments, the placed threshold generator 402 includes one or more programmable bin parameters, which are used to generate the placed thresholds. In one example, the bin parameters include a bin width (e.g., A, a number of bins to generate (N), and a default threshold (R (default)). For example, if Δ=10, N=5, and R (default)=78, then placed thresholds at 53, 63, 73, 83, 93, and 103 would be generated. The exemplary placed thresholds correspond to five bins, each with a width of ten units, where the center bin (i.e., the [73, 83] bin) has a center at the default threshold of 78.

The storage controller 401 may include a storage interface 404. The storage interface 404 receives the placed thresholds from the placed threshold generator 402 and performs reads on the solid state storage 450 using the placed thresholds.

The storage controller 401 may include a bit flip calculator 406 and an optimal threshold estimator 408. The storage interface 404 may pass the read-back bit sequences to bit flip calculator 406. Diagram 350 in FIG. 3B shows one example of read-back bit sequences. The bit flip calculator 406 calculates the bit flip count for each bin and passes the bins (e.g., B1-B5) and corresponding bit flip counts to the optimal threshold estimator 408. The optimal threshold estimator 408 in turn generates an estimated threshold, including by determining a minimum (e.g., a minimum bit, a minimum bin, etc.).

In a first example described below, a minimum bin, which corresponds to the bin having the lowest bit flip count, is selected and is used to generate the estimated threshold. In a second example described below, a curve is fitted to data points corresponding to or otherwise based on the bit flip counts and the minimum of the fitted curve is used to estimate the optimal threshold.

Figure 5:
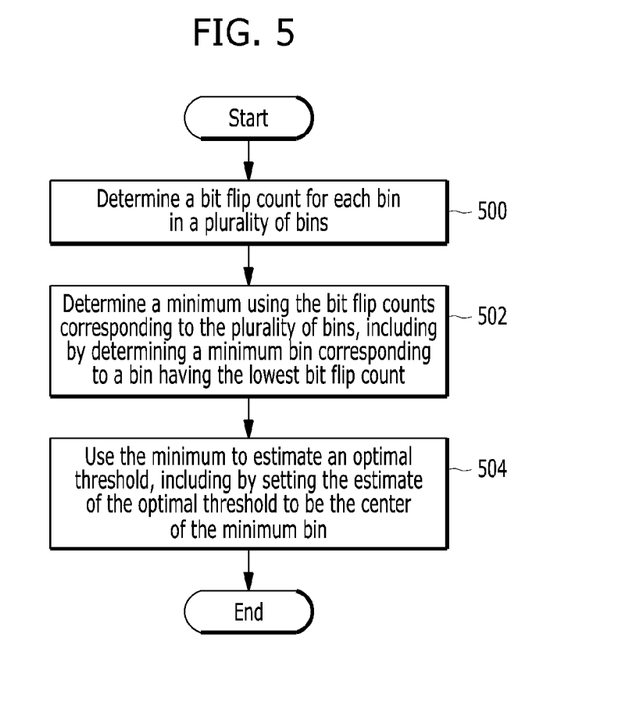
FIG. 5 is a flowchart of steps for estimating an optimal threshold using a minimum bin.

FIG. 5 is a flowchart of steps for estimating an optimal threshold using a minimum bin. At step 500, a bit flip count is determined for each bin in a plurality of bins. The bit flip count may be determined by (1) performing a first read on a group of solid state storage cells at a first threshold that corresponds to a lower bound for a given bin and (2) performing a second read on the group of solid state storage cells at a second threshold that corresponds to an upper bound for the given bin.

At step 502, a minimum is determined using the bit flip counts corresponding to the plurality of bins. The minimum may be determined by determining a minimum bin corresponding to a bin having the lowest bit flip count.

Returning to FIG. 5, at step 504, the minimum is used to estimate an optimal threshold. The minimum may be used to estimate an optimal threshold by setting the estimate of the optimal threshold to be the center of the minimum bin.

The minimum bin technique to find the optimal A, B and C thresholds will be explained.

Let $R_k$ denote the kth read threshold. The function for ones count difference for read $R_1$ and $R_2$ is defined as, $$1_{CD}(R_1, R_2) = |\#1_{R1} - \#1_{R2}|$$

where $\#1_{R1}$ is the number of ones in the read output at read threshold $R_1$ and $\#1_{R2}$ is the number of ones in the read output at read threshold $R_2$. Herein, ones count difference is used to estimate the slope on the cell histogram, however one of skill in the art will recognize that the invention is not limited to this definition of ones count difference. For example, an XOR operation can also be used to estimate the slope on the cell histogram. The step size Δ is used to conduct reads at different read thresholds such that, for example, if two reads at read thresholds $R_1$ and $R_2$ are conducted with step size Δ then $|R_1 - R_2| = \Delta$.

In this technique, it is assumed for simplicity that the same value of the step size (Δ) is used for the A and C thresholds while reading the MSB data. However, this technique can be easily modified accordingly by choosing different step sizes $\Delta_A$ and $\Delta_C$ for the A and C thresholds, respectively.

Figure 6:
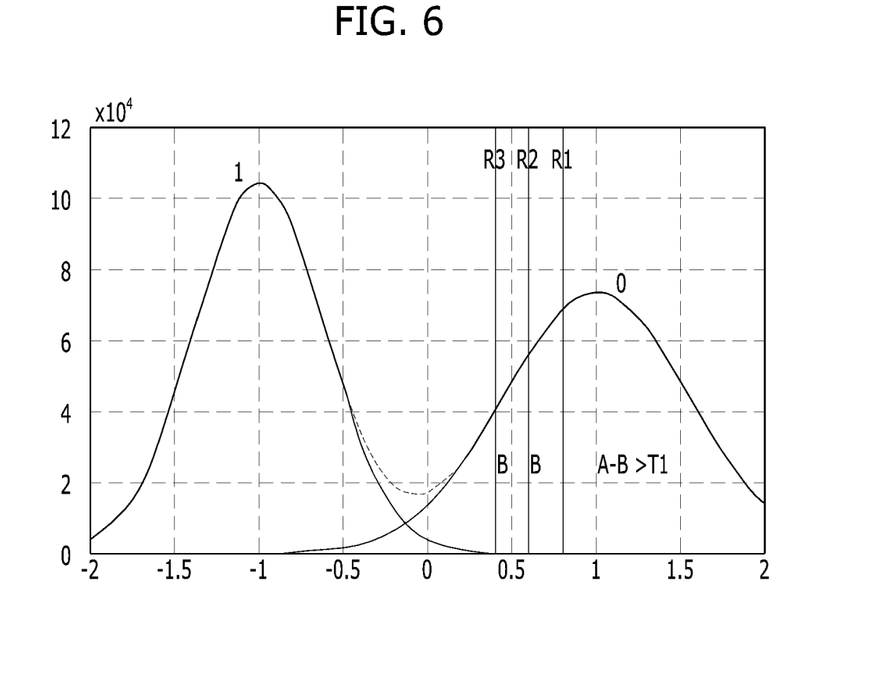
FIG. 6 is a diagram showing an estimated threshold.

The first step is to find the direction of conducting the reads. As shown in FIG. 6, three reads $(R_1, R_2, R_3)$ are conducted at a step size Δ. The ones count difference $R_1$ and $R_2$ is given as, $A = 1_{CD}(R_1, R_2)$. Similarly, $B = 1_{CD}(R_2, R_3)$. The direction (D) is set as, $$D = -1 \text{ if } B < A \text{ and } A - B > T1$$

$$D = 1 \text{ if } B > A \text{ and } B - A > T1$$

$$D = 0 \text{ if } |A - B| \leq T1$$

where T1 is the stopping threshold which is chosen heuristically depending upon the NAND data. If the direction value is 0 (D=0), the technique ends and the optimal read threshold ($X^{minbin}_{opt}$) for or the read thresholds is given as, $$k_{min} = \text{argmin } k \in (2,3)(1_{CD}(R_k, R_{k-1}))$$

$$X^{minbin}_{opt} = (R_{k_{min}} + R_{k_{min}-1})/2.$$

Figure 7:
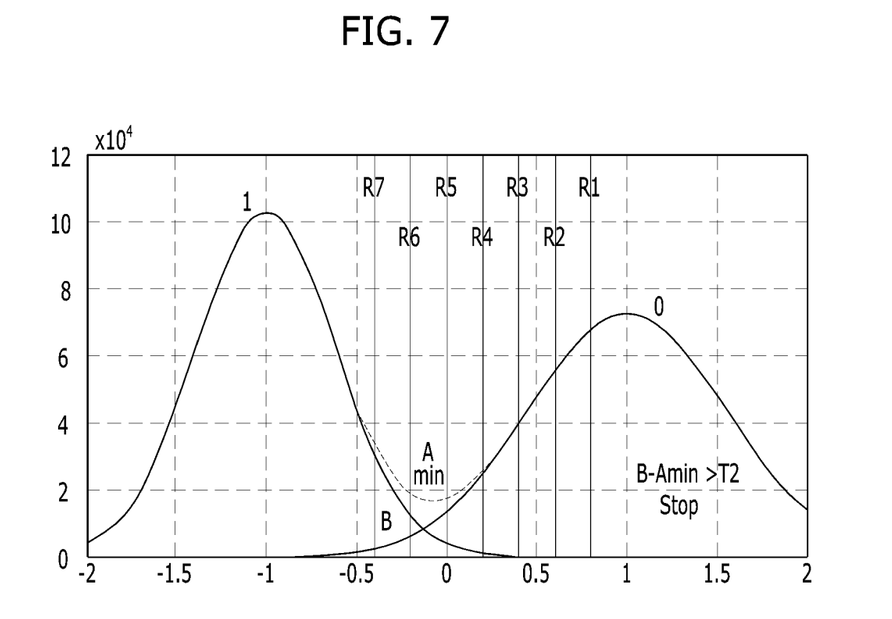
FIG. 7 is a diagram showing conduction of reads.

An embodiment for estimating an optimal read threshold is described below. If the value of D is not equal to 0, further reads are conducted to find the optimal read threshold. The read threshold at the kth time is given as $$R_k = R_{k-1} + D * \Delta$$

where $R_{k-1}$ is the read at (k−1)th time, D is the direction for conducting reads and Δ is the step size. The minimum bin ($A^{(n)}_{min}$) at the nth read (n>2) provides the minimum ones count difference value from $R_1$ to $R_n$ reads and is given as, $A^{(n)}_{min} = \text{Min } k \in (2,n)(1_{CD}(R_k, R_{k-1}))$ $k_{min} = \text{argmin } k \in (2,n)(1_{CD}(R_k, R_{k-1}))$ As shown in FIG. 7, the procedure for finding the minimum bin may stop at the nth read if $(B_n - A^{(n)}_{min}) > T2$ where $B_n = 1_{CD}(R_{n-1}, R_n)$. The value of T2 is chosen heuristically depending upon the NAND data. After finding the minimum bin, the optimal read threshold is given as center of the minimum bin, $X^{minbin}_{opt} = (R_{k_{min}} + R_{k_{min}-1})/2.$ This minimum bin technique can be used for finding the optimal read threshold for all A, B and C thresholds.

Figure 8:
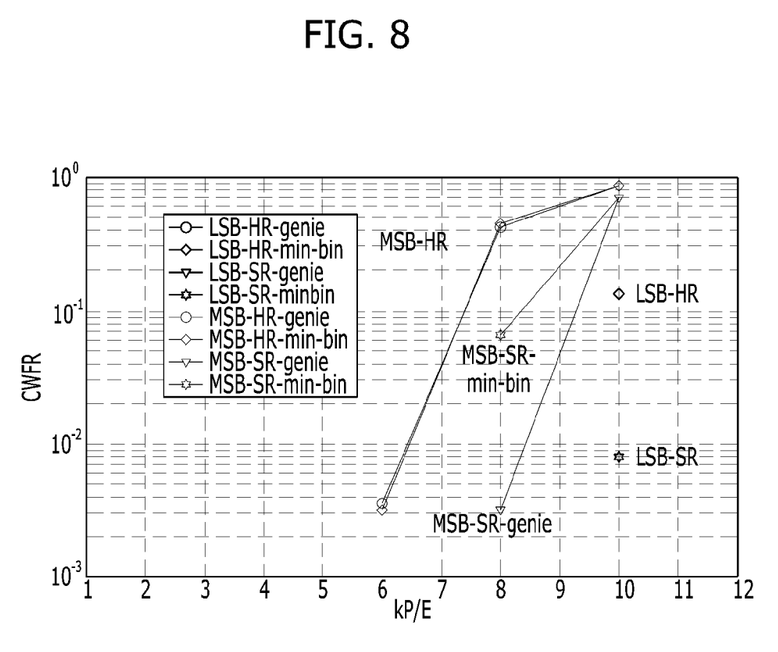
FIG. 8 is a diagram showing a procedure for finding the minimum bin stops.

In FIG. 8, the performance of the minimum bin technique is compared with the genie performance for both the LSB and the MSB data. An LDPC decoder is used for decoding in the depicted results. It can be observed that the minimum bin technique achieves the genie performance for the LSB hard decision decoding, the LSB soft decision decoding and the MSB hard decision decoding but it doesn't achieve the genie performance for the MSB soft decision decoding.

Figure 9:
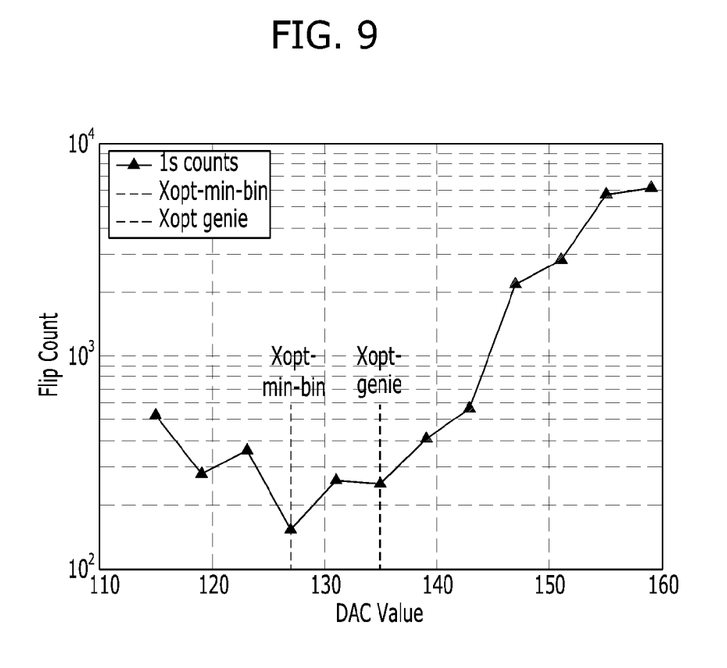
FIG. 9 is a diagram showing performance of a minimum bin technique.

In FIG. 9, the ones count difference is plotted for the A threshold. It can be clearly observed that the estimated A read threshold using the minimum bin is far off from the genie optimal read threshold. The minimum technique gets stuck in the local minima and gives a noisy estimation of the optimal read threshold for the A threshold. This noise in read outputs can be reduced by increasing the step size for the read threshold placement. There may be a tradeoff in increasing the step size with the minimum bin technique. If a smaller value of step size is used, it gives a noisy ones count difference and the minimum bin gets stuck in the local minima, whereas if a larger value of the step size is used, the valley in between cell distribution will be submerged in the ones count difference and it will become difficult to estimate the optimal threshold from this data.

Figure 10:
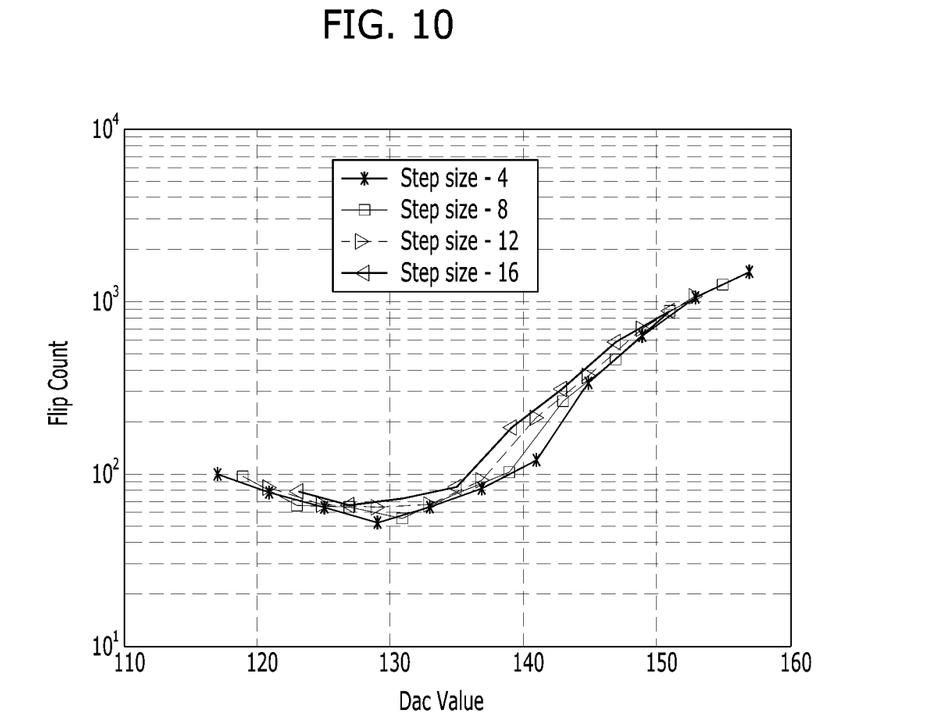
FIG. 10 is a diagram showing plotted count differences.

This tradeoff effect can be observed in FIG. 10. Thus, the value of step size should be chosen appropriately for the A DAC estimation. On NAND data, it is observed that the step size value equal to 12 gives the best performance. We call this optimal step size value and is denoted as $\Delta_{opt}$. The value of $\Delta_{opt}$ can vary across different NAND devices.

A process to find an accurate estimate on the A read threshold using the minimum technique prediction and optimal step size $\Delta_{opt}$ is described below with reference to FIGS. 11, 12, and 13.

Figure 11:
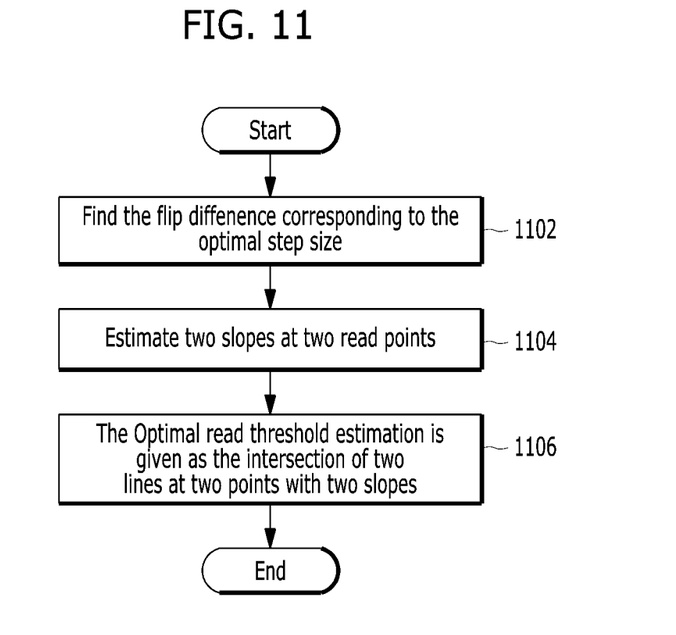
FIG. 11 shows a flowchart illustrating a process for estimating an optimal threshold.

FIG. 11 is a flowchart illustrating an embodiment of a process for estimating an optimal threshold.

In step 1102, the flip difference is found corresponding to the optimal step size $\Delta_{opt}$. Let $F(_{Rk})$ denote the flip difference at reads $(_{Rk-\Delta opt}/2)$ and $(_{Rk+\Delta opt}/2)$. Then $F(_{Rk})$ is given as, $F(R_k) = 1_{CD}(R_k - \Delta_{opt}/2, R_k + \Delta_{opt}/2)/\Delta_{opt}$ In step 1104, slopes $m_1$ and $m_2$ at two read points $X^{minbin}_{opt} - L_L$ and $X^{minbin}_{opt} + L_R$ respectively, are estimated, $m_1 = (F(X^{minbin}_{opt} - L_L + \Delta_m) - F(X^{minbin}_{opt} - L_L))/\Delta_m$ $m_2 = (F(X^{minbin}_{opt} + L_R + \Delta_m) - F(X^{minbin}_{opt} + L_R))/\Delta_m$ Where the values of $L_L$, $L_R$ and $\Delta_m$ are chosen heuristically depending upon the NAND.

Figure 12:
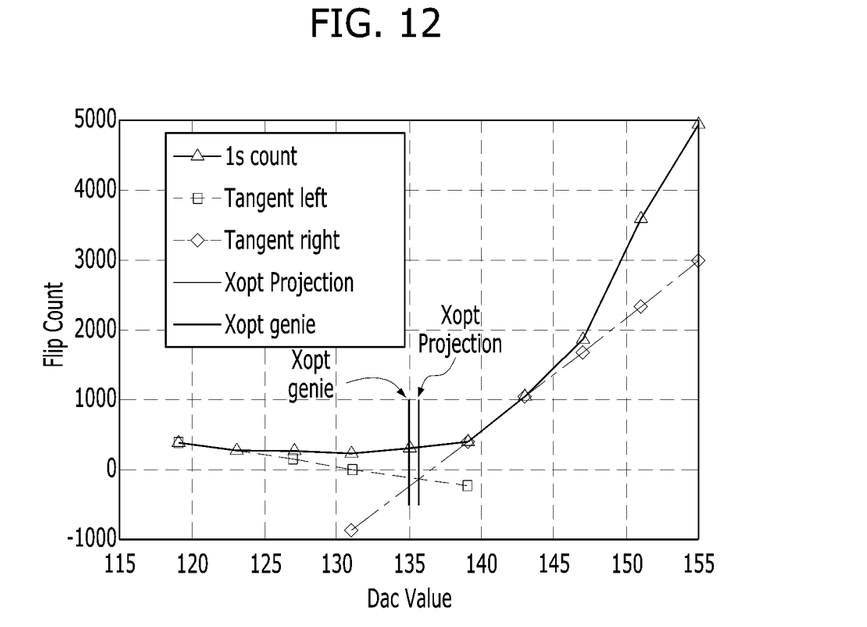
FIG. 12 is a diagram showing an optimal read threshold estimation.

In step 1106, the optimal read threshold estimation $(X^{LP}_{opt})$ is given as the intersection of a line with slope $m_1$ at a read point $(x_1, y_1)$ and a line with slope $m_2$ at a read point $(x_2, y_2)$, $X^{LP}_{opt} = (x_2 m_2 - x_1 m_1 + y_1 - y_2)/(m_2 - m_1)$ where $x_1 = X^{minbin}_{opt} - L_L$, $x_2 = X^{minbin}_{opt} + L_R$, $y_1 = F(x_1)$ and $y_2 = F(x_2)$ (See FIG. 12).

In FIG. 12, it can be observed that the optimal read threshold estimation from this technique is close to the genie read threshold.

Figure 13:
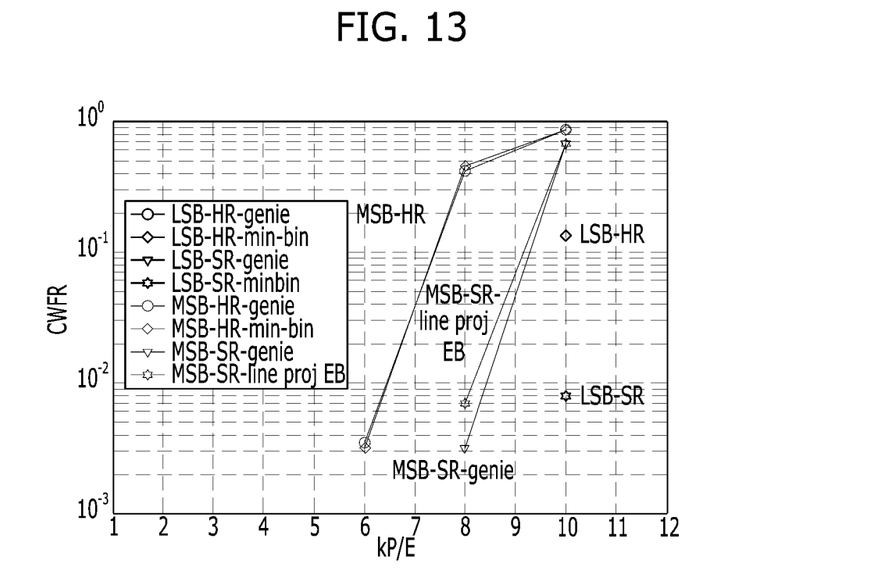
FIG. 13 is a diagram showing performance of an optimal read threshold estimation.

In FIG. 13, the performance from the disclosed process described above is compared with the genie performance. The process disclosed herein solves the noisy A read threshold estimation issue and provides significant performance gains.

While various embodiments have been described above, it will be understood to those skilled in the art that the embodiments described are examples only. Accordingly, the data storage device and the operating method thereof described herein should not be limited based on the described embodiments.

What is claimed:

1. An optimal read threshold estimation method, comprising:

determining a flip difference corresponding to an optimal step size $\Delta_{opt}$;

estimating a first slope $m_1$ at a first read point and a second slope $m_2$ at a second read point, wherein the first read point is a read point to the left of an optimal read threshold $X^{minbin}_{opt}$, the second read point is a read point to the right of the optimal read threshold $X^{minbin}_{opt}$, the first slope m1 and the second slope m2 are slopes on the left side and right side of an estimated read threshold curve, respectively; and obtaining an optimal read threshold estimation $(X^{LP}_{opt})$ as the intersection of a first line with the first slope $m_1$ and a second line with the second slope $m_2$.

2. The optimal read threshold estimation method according to claim 1, wherein the flip difference is determined as $1_{CD}(R_k - \Delta_{opt}/2, R_k + \Delta_{opt}/2)/\Delta_{opt}$ at read points $((R_k - \Delta_{opt}/2)$ and $(R_k + \Delta_{opt}/2))$, where the $R_k$ denotes the read at Kth time, and $1_{CD}(R_{k-1}, R_k)$ is the function for ones count difference between $R_{k-1}$ and $R_k$.

3. The optimal read threshold estimation method according to claim 1, wherein the slopes $m_1$ and $m_2$ are estimated as:

$m_1 = (F(X^{minbin}_{opt} - L_L + \Delta_m) - F(X^{minbin}_{opt} - L_L))/\Delta_m$ $m_2 = (F(X^{minbin}_{opt} + L_R + \Delta_m) - F(X^{minbin}_{opt} + L_R))/\Delta_m$ where the values of $L_L$, $L_R$ and $\Delta_m$ are chosen depending upon a solid state storage, the $L_L$ denotes the shift on the left side of the estimated threshold $X^{minbin}_{opt}$, the $L_R$ is the shift on the right side of the estimated threshold $X^{minbin}_{opt}$, the $\Delta_m$ is the step size, and $F(X^{minbin}_{opt} - L_L + \Delta_m) = 1_{CD}(X^{minbin}_{opt} - L_L + \Delta_m - \Delta_{opt}/2, X^{minbin}_{opt} - L_L + \Delta_m + \Delta_{opt}/2)/\Delta_{opt}$, $F(X^{minbin}_{opt} - L_L) = 1_{CD}(X^{minbin}_{opt} - L_L - \Delta_{opt}/2, X^{minbin}_{opt} - L_L + \Delta_{opt}/2)/\Delta_{opt}$, $F(X^{minbin}_{opt} + L_R + \Delta_m) = 1_{CD}(X^{minbin}_{opt} + L_R + \Delta_m - \Delta_{opt}/2, X^{minbin}_{opt} + L_R + \Delta_m + \Delta_{opt}/2)/\Delta_{opt}$, and $F(X^{minbin}_{opt} + L_R) = 1_{CD}(X^{minbin}_{opt} + L_R - \Delta_{opt}/2, X^{minbin}_{opt} + L_R + \Delta_{opt}/2)/\Delta_{opt}$.

4. The optimal read threshold estimation method according to claim 1, wherein the first read point is $(x_1, y_1)$ and the second read point is $(x_2, y_2)$; and the optimal read threshold is obtained as:

$X^{LP}_{opt} = (x_2 m_2 - x_1 m_1 + y_1 - y_2)/(m_2 - m_1)$ where $x_1 = X^{minbin}_{opt} - L_L$, $x_2 = X^{minbin}_{opt} + L_R$, $y_1 = F(x_1)$ and $y_2 = F(x_2)$, the $L_L$ denotes the shift on the left side of the estimated threshold $X^{minbin}_{opt}$, the $L_R$ is the shift on the right side of the estimated threshold $X^{minbin}_{opt}$, $x_1 m_1$ is product of $x_1$ and $m_1$, and $x_2 m_2$ is product of $x_2$ and $m_2$.

5. The optimal read threshold estimation method according to claim 1, wherein the step size $\Delta_{opt}$ value is 12.

6. The optimal read threshold estimation method according to claim 1, wherein the step size $\Delta_{opt}$ value is determined based on a type of solid state storage.

7. The optimal read threshold estimation method according to claim 1, further comprising, before the determining the flip difference, searching a minimum bin to find optimal read threshold estimates for three read thresholds.

8. The optimal read threshold estimation method according to claim 1, wherein the solid state storage comprises a Multi-Level Cell (MLC) NAND, and two bits (low significant bit (LSB) and most significant bit (MSB)) are programmed on the NAND.

9. A system, comprising:
a solid state storage;
an optimal read threshold estimator; and
an interface suitable for communicating with the solid state storage and the optimal read threshold estimator;
the optimal read threshold estimator being suitable for:
determining a flip difference corresponding to an optimal step size $\Delta_{opt}$; estimating a first slope $m_1$ at a first read point and a second slope $m_2$ at a second read point, wherein the first read point is a read point to the left of an optimal read threshold $X^{minbin}_{opt}$, the second read point is a read point to the right of the optimal read threshold $X^{minbin}_{opt}$, the first slope m1 and the second slope m2 are slopes on the left side and right side of an estimated read threshold curve, respectively; and
obtaining an optimal read threshold estimation ($X^{LP}_{opt}$) as the intersection of a first line with the first slope $m_1$ and a second line with the second slope $m_2$.

10. The system according to claim 9, wherein the flip difference is determined as $1_{CD}(R_k-\Delta_{opt}/2, R_k+\Delta_{opt}/2)/\Delta_{opt}$ at read points (($R_k-\Delta_{opt}/2$) and ($R_k+\Delta_{opt}/2$)), where the $R_k$ denotes the read at Kth time, and $1_{CD}(R_{k-1}, R_k)$ is the function for ones count difference between $R_{k-1}$ and $R_k$.

11. The system according to claim 9, wherein the slopes $m_1$ and $m_2$ are estimated as:

$$m_1 = (F(X^{minbin}_{opt}-L_L+\Delta_m) - F(X^{minbin}_{opt}-L_L))/\Delta_m$$

$$m_2 = (F(X^{minbin}_{opt}+L_R+\Delta_m) - F(X^{minbin}_{opt}+L_R))/\Delta_m$$

where the values of $L_L$, $L_R$ and $\Delta_m$ are chosen depending upon a solid state storage, the $L_L$ denotes the shift on the left side of the estimated threshold $X^{minbin}_{opt}$, the $L_R$ is the shift on the right side of the estimated threshold $X^{minbin}_{opt}$, the $\Delta m$ is the step size, and $$F(X^{minbin}_{opt}-L_L+\Delta_m) = 1_{CD}(X^{minbin}_{opt}-L_L+\Delta_m-\Delta_{opt}/2, X^{minbin}_{opt}-L_L+\Delta_m+\Delta_{opt}/2)/\Delta_{opt},$$

$$F(X^{minbin}_{opt}-L_L) = 1_{CD}(X^{minbin}_{opt}-L_L-\Delta_{opt}/2, X^{minbin}_{opt}-L_L+\Delta_{opt}/2)/\Delta_{opt},$$

$$F(X^{minbin}_{opt}-L_R+\Delta_m) = 1_{CD}(X^{minbin}_{opt}-L_R+\Delta_m-\Delta_{opt}/2, X^{minbin}_{opt}-L_R+\Delta_m+\Delta_{opt}/2)/\Delta_{opt}, \text{ and}$$

$$F(X^{minbin}_{opt}-L_R) = 1_{CD}(X^{minbin}_{opt}-L_R-\Delta_{opt}/2, X^{minbin}_{opt}-L_R+\Delta_{opt}/2)/\Delta_{opt}.$$

12. The system according to claim 9, wherein the first read point is ($x_1$, $y_1$) and the second read point is ($x_2$, $y_2$) and the optimal read threshold is obtained as:

$$X^{LP}_{opt} = (x_2 m_2 - x_1 m_1 + y_1 - y_2)/(m_2 - m_1)$$

where $x_1 = X^{minbin}_{opt} - L_L$, $x_2 = X^{minbin}_{opt} + L_R$, $y_1 = F(x_1)$ and $y_2 = F(x_2)$, where, the $L_L$ denotes the shift on the left side of the estimated threshold $X^{minbin}_{opt}$, the $L_R$ is the shift on the right side of the estimated threshold $X^{minbin}_{opt}$, $x_1 m_1$ is product of $x_1$ and $m_1$, and $x_2 m_2$ is product of $x_2$ and $m_2$.

13. The system according to claim 9, wherein the step size $\Delta_{opt}$ value is 12.

14. The system according to claim 9, wherein the step size $\Delta_{opt}$ value is determined based on a type of solid state storage.

15. The system according to claim 9, wherein the optimal read threshold estimator is further suitable for, before the determining the flip difference, searching a minimum bin to find optimal read threshold estimates for three read thresholds.

16. The system according to claim 9, wherein the solid state storage comprises a Multi-Level Cell (MLC) NAND, and two bits (low significant bit (LSB) and most significant bit (MSB)) are programmed on the NAND.

17. A computer implemented process for estimating an optimal read threshold, comprising program instructions to:
determine a flip difference corresponding to an optimal step size $\Delta_{opt}$;
estimate a first slope $m_1$ at a first read point and a second slope $m_2$ at a second read point, wherein the first read point is a read point to the left of an optimal read threshold $X^{minbin}_{opt}$, the second read point is a read point to the right of the optimal read threshold $X^{minbin}_{opt}$, the first slope m1 and the second slope m2 are slopes on the left side and right side of an estimated read threshold curve, respectively; and
obtain an optimal read threshold estimation ($X^{LP}_{opt}$) as the intersection of a first line with the first slope $m_1$ and a second line with the second slope $m_2$.

18. The computer implemented process according to claim 17, wherein the flip difference is determined as $1_{CD}(R_k-\Delta_{opt}/2, R_k+\Delta_{opt}/2)/\Delta_{opt}$ at read points (($R_k-\Delta_{opt}/2$) and ($R_k+\Delta_{opt}/2$)), where the $R_k$ denotes the read at Kth time, and $1_{CD}(R_{k-1}, R_k)$ is the function for ones count difference between $R_{k-1}$ and $R_k$.

19. The computer implemented process according to claim 17, wherein the slopes $m_1$ and $m_2$ are estimated as:

$$m_1 = (F(X^{minbin}_{opt}-L_L+\Delta_m) - F(X^{minbin}_{opt}-L_L))/\Delta_m$$

$$m_2 = (F(X^{minbin}_{opt}+L_R+\Delta_m) - F(X^{minbin}_{opt}+L_R))/\Delta_m$$

where the values of $L_L$, $L_R$ and $\Delta_m$ are chosen depending upon a solid state storage, the $L_L$ denotes the shift on the left side of the estimated threshold $X^{minbin}_{opt}$, the $L_R$ is the shift on the right side of the estimated threshold $X^{minbin}_{opt}$, the $\Delta m$ is the step size, and $$F(X^{minbin}_{opt}-L_L+\Delta_m) = 1_{CD}(X^{minbin}_{opt}-L_L+\Delta_m-\Delta_{opt}/2, X^{minbin}_{opt}-L_L+\Delta_m+\Delta_{opt}/2)/\Delta_{opt},$$

$$F(X^{minbin}_{opt}-L_L) = 1_{CD}(X^{minbin}_{opt}-L_L-\Delta_{opt}/2, X^{minbin}_{opt}-L_L+\Delta_{opt}/2)/\Delta opt,$$

$$F(X^{minbin}_{opt}-L_R+\Delta_m) = 1_{CD}(X^{minbin}_{opt}-L_R+\Delta_m-\Delta_{opt}/2, X^{minbin}_{opt}-L_R+\Delta_m+\Delta_{opt}/2)/\Delta_{opt}, \text{ and}$$

$$F(X^{minbin}_{opt}-L_R) = 1_{CD}(X^{minbin}_{opt}-L_R-\Delta_{opt}/2, X^{minbin}_{opt}-L_R+\Delta_{opt}/2)/\Delta_{opt}$$

20. The computer implemented process according to claim 17, wherein the first read point is ($x_1$, $y_1$) and the second read point is $(x_2, y_2)$; and the optimal read threshold is obtained as:

$$X^{LP}_{opt}=(x_2 m_2 - x_1 m_1 + y_1 - y_2)/(m_2 - m_1)$$

where $x_1 = X^{minbin}_{opt} - L_L$, $x_2 = X^{minbin}_{opt} + L_R$, $y_1 = F(x_1)$ and $y_2 = F(x_2)$, the $L_L$ denotes the shift on the left side of the estimated threshold $X^{minbin}_{opt}$, the $L_R$ is the shift on the right side of the estimated threshold $X^{minbin}_{opt}$, $x_1 m_1$ is product of $x_1$ and $m_1$, and $x_2 m_2$ is product of $x_2$ and $m_2$.

21. The computer implemented process according to claim 17, wherein the step size $\Delta_{opt}$ value is 12.

22. The computer implemented process according to claim 17, wherein the step size $\Delta_{opt}$ value is determined based on a type of solid state storage.

23. The computer program product according to claim 17, wherein the program instructions further comprise searching a minimum bin to find optimal read threshold estimates for three read thresholds before the determining the flip difference.

24. The computer program product according to claim 17, wherein the solid state storage comprises a Multi-Level Cell (MLC) NAND, and two bits (low significant bit (LSB) and most significant bit (MSB)) are programmed on the NAND.

\* \* \* \* \*